(12) United States Patent
Beckous et al.

(10) Patent No.: US 7,015,708 B2
(45) Date of Patent: Mar. 21, 2006

(54) METHOD AND APPARATUS FOR A HIGH FREQUENCY, IMPEDANCE CONTROLLED PROBING DEVICE WITH FLEXIBLE GROUND CONTACTS

(75) Inventors: Frank R. Beckous, Newark, DE (US); Paul A. Czikora, Hockessin, DE (US); John J. Squires, Elkton, MD (US)

(73) Assignee: Gore Enterprise Holdings, Inc., Newark, DE (US)

( * ) Notice: Subject to any disclaimer, the term of this patent is extended or adjusted under 35 U.S.C. 154(b) by 0 days.

(21) Appl. No.: 10/618,475

(22) Filed: Jul. 11, 2003

(65) Prior Publication Data

US 2005/0007128 A1 Jan. 13, 2005

(51) Int. Cl.
*G01R 31/02* (2006.01)

(52) U.S. Cl. .......................... 324/754; 324/761
(58) Field of Classification Search ........ 324/754–758, 324/761–762, 158.1
See application file for complete search history.

(56) References Cited

U.S. PATENT DOCUMENTS

| | | | |
|---|---|---|---|
| 4,035,723 A | 7/1977 | Kvaternik | 324/754 |
| 4,504,780 A | 3/1985 | Marsella | 324/72.5 |
| 4,508,405 A | 4/1985 | Damon et al. | 439/260 |
| 4,740,746 A * | 4/1988 | Pollock et al. | 324/761 |
| 4,795,352 A * | 1/1989 | Capp et al. | 439/63 |
| 4,931,726 A | 6/1990 | Kasukabe et al. | 324/754 |
| 5,004,977 A * | 4/1991 | Kazama | 324/754 |
| 5,291,129 A * | 3/1994 | Kazama | 324/757 |
| 5,308,250 A * | 5/1994 | Walz | 439/63 |
| 5,416,429 A | 5/1995 | McQuade et al. | 324/762 |
| 5,477,159 A | 12/1995 | Hamling | 324/754 |
| 5,525,911 A | 6/1996 | Marumo et al. | 324/754 |
| 5,917,330 A | 6/1999 | Miley | 324/762 |
| 5,952,839 A | 9/1999 | Fredrickson | 324/754 |
| 5,982,187 A * | 11/1999 | Tarzwell | 324/756 |
| 6,053,777 A * | 4/2000 | Boyle | 439/700 |
| 6,160,412 A | 12/2000 | Martel et al. | 431/761 |
| 6,196,866 B1 | 3/2001 | Gaschke | 439/482 |
| 6,275,054 B1 * | 8/2001 | Boyle | 324/754 |
| 6,447,328 B1 | 9/2002 | Feldman | 439/482 |
| 6,498,506 B1 | 12/2002 | Beckous | 324/761 |
| 6,758,680 B1 * | 7/2004 | Duquerroy et al. | 439/63 |

* cited by examiner

*Primary Examiner*—Paresh Patel
(74) *Attorney, Agent, or Firm*—Allan M. Wheatcraft

(57) ABSTRACT

A spring loaded, high frequency, controlled impedance, coaxial probe assembly located within an insulated or conductive housing. A high frequency coaxial probe assembly consisting of a central contact which is fixed or axially floating within a controlled impedance connector body or assembly. A flexible, elastically de-formable, fixed or field replaceable and detachable, ground contact, snapped on and retained in place upon the controlled impedance connector body or assembly creating a fixed or axially floating reference plane or dimension from which the head of the probe contact will protrude through the controlled impedance connector body. The individual, high frequency, controlled impedance, coaxial probe assemblies are spring loaded to provide continuous axial signal contact, when deployed to a planar device such as a DUT (Device Under Test) board. The flexible, elastically de-formable, fixed or field replaceable and detachable, ground contact(s) provide a resilient and continuous wiping action. This wiping action removes oxides or material from the surface of the conductive elements of the planar device ground plane. This ensures contact with the conductive elements of the ground plane of the planar device, while reducing the inductance, by minimizing the total ground loop length between the outgoing and returning current paths.

7 Claims, 3 Drawing Sheets

METHOD AND APPARATUS FOR A HIGH FREQUENCY, IMPEDANCE CONTROLLED PROBING DEVICE WITH FLEXIBLE GROUND CONTACTS

BACKGROUND OF THE INVENTION

The present invention relates to spring probe assemblies of the type used in ATE (Automatic Test Equipment) and other industries which require testing of integrated circuits and specifically to spring probe assemblies to be used at microwave frequencies (10 GHz+).

Spring probe assemblies are extensively used in the ATE industry, as well as other industries, which require testing of integrated circuits, silicon wafers, etc. in order to provide temporary contact to planar devices such as DUT (Device Under Test) boards in order to interrogate the various inputs and outputs of the integrated circuits which are plugged onto the DUT board for test. Conventional spring probe assemblies use spring pins in the ground and signal positions which create impedance mismatches when disposed upon the planar device. These impedance mismatches seriously limit the frequency at which the integrated circuits under test can be interrogated. For this reason, the conventional coaxial spring probe was designed to compensate for much of this impedance mismatch by providing a coaxial ground tube which provides an impedance match, around the signal pin, for the majority of the spring travel, during test implementation. While the impedance mismatch, using a coaxial spring probe, is improved, a typical coaxial spring probe still has limitations due to impedance mismatches of the materials, internal to the coaxial spring probe, which hold the coaxial spring ground tube and the signal spring pin in place. These mismatches typically limit frequency performance to under 6 GHz. A coaxial spring probe having better controlled impedance mismatch is highly desirable.

SUMMARY OF THE INVENTION

This invention is that of a high frequency, impedance controlled, coaxial probe assembly. The coaxial probe assembly is based on a microwave frequency connector which has a fixed or axially floating central contact, which is typically made from a conductive material such as beryllium-copper, phosphor-bronze, etc., in it's center. This central contact makes connection with a planar device, such as a DUT (Device Under Test) board, when the planar device is moved toward the high frequency, impedance controlled, coaxial probe assembly. Upon the mating of the central contact with the planar device the impedance controlled, coaxial probe assembly will be pushed back into the insulating housing. Springs, which are held in place by a rear retaining rail and an insulating bushing, provide forces sufficient to maintain continuity between the coaxial probe contact and the planar device throughout testing. The high frequency, controlled impedance, path is completed by using a flexible, elastically deformable, fixed or field replaceable and detachable, ground contact which is snapped on and retained in place upon the controlled impedance connector body of the high frequency, controlled impedance, coaxial probe assembly. This flexible, elastically de-formable, fixed or field replaceable and detachable, ground contact(s) have at least one contact feature where the protruding end(s) of a stamped part are formed such that they will engage the ground plane of the planar device, before the central contact engages the planar device. These protruding end(s) then deflect and deform until the central contact engages the planar device. The relationship of the ground contacts and the central contact are such that, when the central contact is engaged with the planar device, the air gap between the planar device and the front surface of the controlled impedance coaxial probe assembly is minimized. The central contact and ground contact(s) are designed to maintain integral contact, with the planar device, even when variations in the surface ("Z" axis), as well as the signal and ground contact locations ("X" and "Y" axes), of the planar device vary as much as ±0.025 inches. This minimal impedance discontinuity at the contact area of the planar device, results in a frequency performance through at least 12 GHz and conceivably through 65 GHz. In addition to the microwave frequency performance, the probe housing is designed such that individual lines are easily removed for repair or replacement. In addition, if so desired, the ground contacts are easily replaced individually while the probe housing remains assembled.

DETAILED DESCRIPTION OF THE INVENTION

Figure 1:
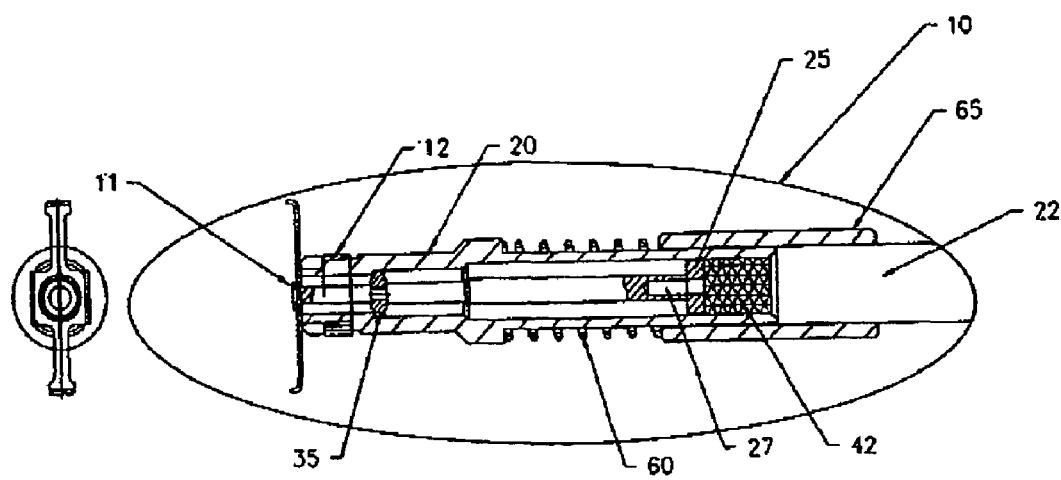
FIG. 1 is a cross section of the high frequency, impedance controlled, probe assembly.

The present invention will now be described in connection with FIGS. 1–4, which represents preferred embodiments of the invention. FIG. 1 is a side cross-sectional view of a coaxial probe assembly 10 according to one embodiment of the invention. Coaxial probe assembly 10 comprises coaxial connector body 20 having a signal contact 11 disposed centrally therewithin. A ground contact 12 is connected to coaxial connector body 20.

Coaxial probe assembly 10 is preferably a high frequency, impedance controlled, coaxial probe assembly. The advantages of the present invention are most evident with such an assembly.

Signal contact 11 is preferably made from materials such as beryllium-copper, copper or phosphor-bronze.

Ground contact 12 is preferably stamped from materials such as beryllium-copper, copper or phosphor-bronze. It may be fixedly attached to coaxial connector body 20. Alternatively, it may be detachably mounted on coaxial connector body 20, such as by a snap fit or a friction fit. Detachably mounting ground contact 12 on coaxial connector body 20 is preferred because it provides certain additional advantages for the present invention. Specifically, detachably mounting ground contact 12 provides for easy replacement in the event it breaks in use. Such "field replaceability" is advantageous because the whole assembly does not need to be removed for repair, and there is less down time for making the repair.

Figure 2:
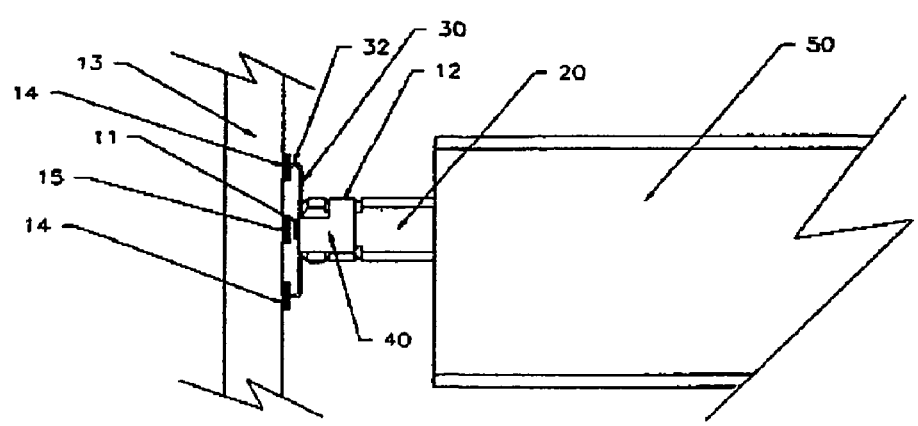
FIG. 2 is a side view of the spring probe housing showing the high frequency, controlled Impedance probe assembly as loaded into an insulating housing.

FIG. 2 is a side view of coaxial probe assembly 10 mounted within and protruding from a housing 50 and connecting to a planar device 13. As used herein, "planar" means "substantially planar," to allow for surface irregularities. Planar device 13 is typically a DUT board, and comprises at least a ground surface 14 and a signal surface 15. As shown in FIG. 2, ground contact 12 has a main body 40 and a resilient contact member 30 extending substantially radially from said main body 40. In the embodiment shown, there are two such resilient contact members 30, and the invention is intended to encompass all configurations of resilient members that will be recognized by those skilled in the art based on the disclosure herein. Resilient members 30 include a tip 32 that is adapted to make contact with ground surface 14. Preferably, tip 32 extends further toward planar device 13 than signal contact 11. In this way, tip 32 makes contact with ground surface 14 before signal contact 11 contacts signal surface 15. As planar surface 13 is moved further toward signal contact 11, such that signal contact 11 makes contact with signal surface 15, resilient contact members 30 deflect backward to allow such contact between signal contact 11 and signal surface 15, while at the same time maintaining contact between tip 32 and ground surface 14. In this manner, when a plurality of coaxial probe assemblies 10 are mounted in housing 50, irregularities in planar device 13 or variations in signal contact 11 lengths can be accommodated by the flexibility of resilient contact members 30. This ensures good contact between all signal contacts 11 and signal surfaces 15 as well as tips 32 and ground surfaces 14 along planar device 13. As a result, better data integrity is achievable.

Referring back to FIG. 1, rear insulating bead 25, which is made from such materials as Ultem, PTFE or Torlon is disposed onto a central conductor 27 of coaxial cable 22. Central conductor 27 is connected to the rear of the central contact 11 and secured using conventional soldering, crimping, conductive epoxy or by mechanical means. A front insulator 35 made from such materials as Ultem, PTFE or Torlon, is disposed over the central contact 11, which is then disposed within impedance controlled connector body 20. Impedance controlled connector body 20 is then secured onto the coaxial cable braid 42, using conventional soldering, crimping, conductive epoxy or by mechanical means. Coaxial probe assembly 10 also comprises, in a preferred embodiment, a spring 60. The spring is held, in a pre-loaded force, using an insulating bushing 65 made from materials such as PTFE, Ultem or Torlon.

Figure 3:
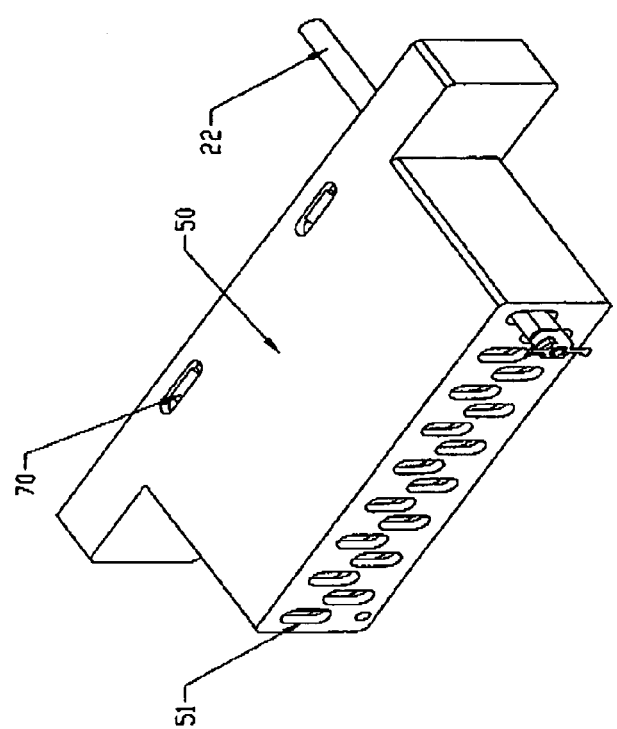
FIG. 3 is an oblique view of the high frequency, impedance controlled, probe assembly.

FIG. 3 is an oblique view of a housing 50 comprising apertures 51 for a plurality of coaxial probe assemblies 10 (only one of which is shown in FIG. 3) according to an exemplary embodiment of the invention. Housing 50 is an insulating housing made from a thermoplastic material such as LCP or Ultem. Bushing 65, spring 60, and controlled impedance coaxial probe assembly 10 are retained in apertures 51 of housing 50 by a rear retainer 70 made from materials such as LCP or Ultem.

Figure 4:
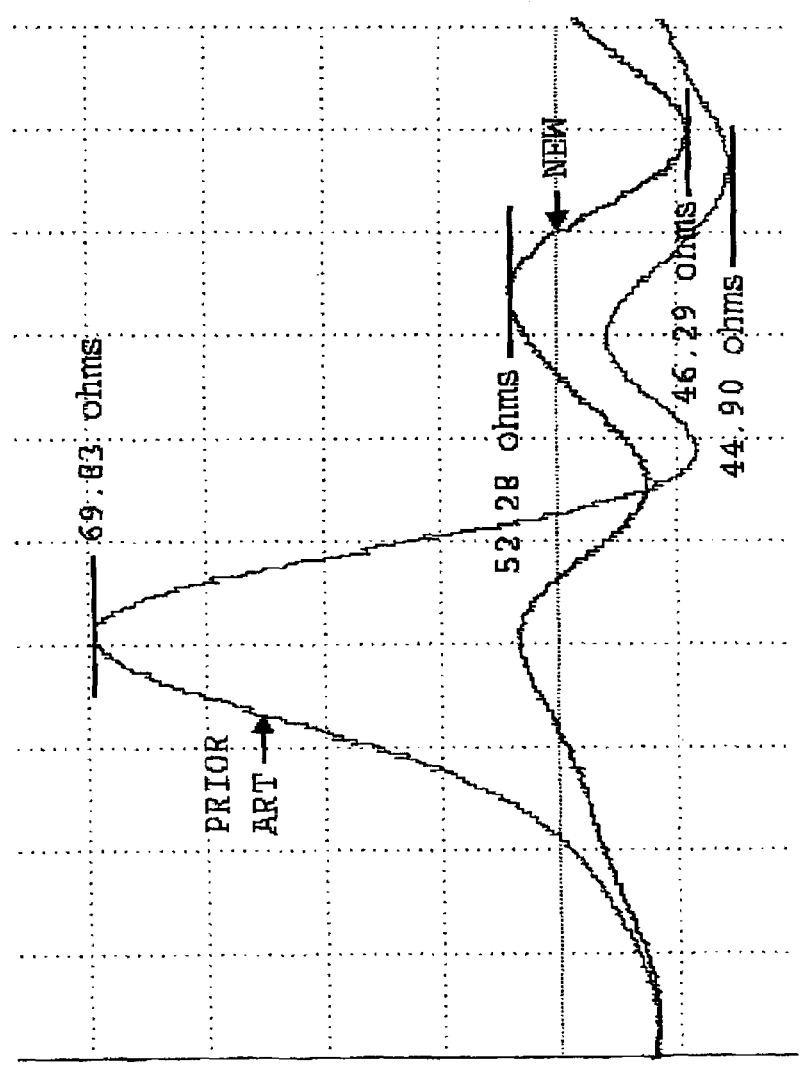
FIG. 4 is a graph depicting impedance test data for a typical, prior art, spring probe assembly vs. the high frequency, impedance controlled, probe assembly of the present invention.

FIG. 4 is a graph showing impedance test data for a typical, prior art, spring probe assembly (labeled "Prior Art" on the drawing vs. the high frequency, impedance controlled, probe assembly, as described herein (labeled "New"). The data represented was generated using a time domain reflectometer (Techtronics 11801) with a 33 pS risetime input signal, equivalent to a 30 GHz frequency. The plots illustrate the much more controlled impedance achievable using the present invention.

Using the construction described herein, the present invention provides for a high frequency (greater than 12 GHz), electrically stable, low inductance (less than 5% reflection), signal path to interface microwave frequency signals on and off of a planar device such as a DUT board. In addition, the flexible, elastically de-formable, fixed or field replaceable and detachable, ground contact(s) provide a resilient and continuous wiping action. This wiping action removes oxides or material from the surface of the conductive elements of the planar device ground plane. This ensures contact with the conductive elements of the ground plane of the planar device, while reducing the inductance, by minimizing the total ground loop length between the outgoing and returning current paths.

While the invention has been disclosed in preferred embodiments, various modifications may be made therein by those skilled in the art without departing from the spirit and scope of the invention, as defined in the appended claims.

The invention claimed is:

1. An apparatus having a coaxial signal contact and ground contact, for mating to a planar device having a ground surface and a signal surface, comprising:
   a) a coaxial connector body;
   b) said signal contact disposed central to the coaxial connector body;
   c) said ground contact attached to the coaxial connector body, said ground contact comprising a main body and at least one resilient contact member which is elastically deformable;
   d) said at least one resilient contact member which is elastically deformable extending only radially from said main body; and
   e) said at least one resilient contact member which is elastically deformable comprising a tip adapted to make contact with said ground surface of said planar device.

2. The apparatus of claim 1 wherein said apparatus is disposed within an insulating housing such that the entire apparatus is spring loaded within an insulating housing.

3. The apparatus of claim 1 wherein said apparatus is disposed within a conductive housing such that the entire apparatus is spring loaded within a conductive housing.

4. The apparatus of claim 1 wherein said ground contact device is disposable and replaceable.

5. The apparatus of claim 1 wherein said ground contact device is fixed to said coaxial connector body.

6. The apparatus of claim 1 wherein said signal contact is fixed within said coaxial connector body.

7. The apparatus of claim 1 wherein said signal contact is spring-loaded within said coaxial connector body.

\* \* \* \* \*